(12) United States Patent
Kube

(10) Patent No.: US 11,121,570 B2
(45) Date of Patent: Sep. 14, 2021

(54) BATTERY DISCONNECTING DEVICE

(71) Applicant: Volkswagen Aktiengesellschaft, Wolfsburg (DE)

(72) Inventor: Roland Kube, Schwulper (DE)

(73) Assignee: VOLKSWAGEN AKTIENGESELLSCHAFT, Wolfsburg (DE)

(*) Notice: Subject to any disclaimer, the term of this patent is extended or adjusted under 35 U.S.C. 154(b) by 705 days.

(21) Appl. No.: 15/718,364

(22) Filed: Sep. 28, 2017

(65) Prior Publication Data

US 2018/0097390 A1 Apr. 5, 2018

(30) Foreign Application Priority Data

Sep. 30, 2016 (DE) ............. 10 2016 219 098.9

(51) Int. Cl.
| | |
|---|---|
| *H01M 10/42* | (2006.01) |
| *H02J 7/00* | (2006.01) |
| *H03K 17/567* | (2006.01) |
| *H03K 17/687* | (2006.01) |
| *H03K 17/12* | (2006.01) |
| *H01M 50/572* | (2021.01) |

(52) U.S. Cl.
CPC ........... *H02J 7/0068* (2013.01); *H01M 10/42* (2013.01); *H01M 50/572* (2021.01); *H02J 7/0031* (2013.01); *H03K 17/122* (2013.01); *H03K 17/127* (2013.01); *H03K 17/567* (2013.01); *H03K 17/687* (2013.01)

(58) Field of Classification Search
USPC .................................................. 307/9.1, 115
See application file for complete search history.

(56) References Cited

U.S. PATENT DOCUMENTS

| | | | | |
|---|---|---|---|---|
| 2011/0316489 A1* | 12/2011 | Norimatsu | ............. | H02M 1/36 320/166 |
| 2012/0018404 A1 | 1/2012 | Matsuo et al. | | |
| 2012/0056477 A1 | 3/2012 | Herges et al. | | |
| 2012/0191294 A1* | 7/2012 | Boiron | ............... | G01R 31/3278 701/33.8 |

(Continued)

FOREIGN PATENT DOCUMENTS

| | | |
|---|---|---|
| CN | 102318176 A | 1/2012 |
| CN | 102438854 A | 5/2012 |

(Continued)

OTHER PUBLICATIONS

Office Action for Chinese Patent Application No. 201710896739.9, dated Jun. 15, 2020.

*Primary Examiner* — Toan T Vu
*Assistant Examiner* — Xuan Ly
(74) *Attorney, Agent, or Firm* — Pearl Cohen Zedek Latzer Baratz LLP

(57) ABSTRACT

A battery disconnecting device has a first input and a second input to which a battery can be connected, whereby the disconnecting device also has a first output and a second output to which an electric component can be connected, whereby at least one first circuit breaker is arranged between the first input and the first output, and at least one second circuit breaker is arranged between the second input and the second output, whereby the first circuit breaker is at least a transistor and the second circuit breaker is a relay.

5 Claims, 3 Drawing Sheets

(56) References Cited

U.S. PATENT DOCUMENTS

| | | | | |
|---|---|---|---|---|
| 2015/0002975 A1* | 1/2015 | Rozman | ............... | H02H 9/047 |
| | | | | 361/111 |
| 2016/0247650 A1* | 8/2016 | Tanaka | ............... | H01H 47/325 |
| 2016/0254686 A1 | 9/2016 | Steil | | |
| 2017/0229872 A1* | 8/2017 | Ghotra | ............... | H02J 3/381 |

FOREIGN PATENT DOCUMENTS

| | | |
|---|---|---|
| CN | 102511009 A | 6/2012 |
| CN | 103 158 578 A | 6/2013 |
| CN | 203318187 U | 12/2013 |
| CN | 105612082 A | 5/2016 |
| CN | 109075581 A | 12/2018 |
| DE | 10 2009 019 531 A1 | 12/2009 |
| DE | 10 2011 078 245 A1 | 12/2011 |
| DE | 10 2011 015 694 A1 | 10/2012 |
| DE | 10 2012 017 673 A1 | 6/2013 |
| DE | 10 2012 210 602 A1 | 12/2013 |
| DE | 11 2012 006 181 T5 | 12/2014 |
| EP | 620 645 A2 | 10/1994 |
| EP | 2 124 340 A2 | 11/2009 |
| JP | 2006320072 A | 11/2006 |
| WO | WO 2012/007494 A1 | 1/2012 |

\* cited by examiner

BATTERY DISCONNECTING DEVICE

CROSS REFERENCE TO RELATED APPLICATION

This application claims priority from German Patent Application No. 10 2016 219 098.9, filed Sep. 30, 2016, which is incorporated herein by reference in its entirety.

BACKGROUND OF THE INVENTION

The invention relates to a battery disconnecting device.

Battery disconnecting devices are needed in order to systematically connect or disconnect a battery. In this context, the battery is, for instance, a high-voltage battery of a traction system in an electric or hybrid vehicle.

Such a battery disconnecting device is disclosed, for example, in German patent application DE 10 2011 015 694 A1. Here, the battery disconnecting device has a first input as well as a second input to which that a battery can be connected, whereby the battery disconnecting device also has a first output and a second output to which an electric component can be connected. The electric component is, for instance, a power electronic system that serves to actuate an electric machine. A first circuit breaker in the form of a relay is arranged between the first input and the first output, while a second circuit breaker in the form of a relay is arranged between the second input and the second output, and these serve for the all-pole galvanic disconnection of the battery. The battery disconnecting device also comprises a precharging relay with a precharging resistor via which the switch-on current can be limited. In this context, the precharging relay with the precharging resistor can also be replaced by transistors having series-connected relays. Once the precharging procedure is finished, the parallel-connected main relay is closed and the precharging path is opened. Since relays are relatively low-resistance, the heat loss does not pose a major problem. A drawback of relays is their relatively slow switching time in comparison to power semiconductors.

Particularly in view of the switching times and the requisite precharging path, semiconductors, especially transistors, have been proposed as substitutes for the relays.

German patent application DE 10 2012 210 602 A1 discloses a battery disconnecting device having a transistor that is configured, for example, as an IGBT or MOSFET. In this context, the transistor is associated with a diode bridge that is connected to the battery bank and to the transistor in such a way that a current flowing through the transistor always flows forward through the transistor, irrespective of the direction of the current through the battery bank. This solves the problem that the transistors only have a limited blocking ability in the reverse direction (inverse operation) and also display worse characteristic values in the conductive state. A disadvantage of this circuit is that the current always has to flow via two diodes and the transistor. This increases the losses and gives rise to problems in terms of the heat dissipation of the power loss.

German patent application DE 10 2009 019 531 A1 discloses a load interrupter switch for a traction system consisting of two anti-parallel power arms, each having one IGBT and an associated blocking diode, whereby, in addition, a power MOSFET is arranged in a third power arm. The IGBTs arranged anti-parallel in the two power arms allow power take-off as well as simultaneous recuperation, that is to say, charging of the vehicle batteries. If one of the two power arms is in the conductive state, a voltage of approximately 5 V is typically still present at the appertaining IGBT. The power loss associated with this can be further reduced by switching the power MOSFET since it has a resistance in the m$\Omega$ range when in the conductive state.

SUMMARY OF THE INVENTION

The invention is based on the technical objective of creating a battery disconnecting device by means of which fast switching times can be attained, while limiting the power loss.

This technical objective is achieved by means of a battery disconnecting device having the features of the independent claim(s). Additional advantageous embodiments of the invention ensue from the subordinate claims.

The battery disconnecting device here has a first input and a second input to which a battery can be connected. Moreover, the battery disconnecting device has a first output and a second output to which an electric component can be connected, whereby at least one first circuit breaker that is configured as a transistor is arranged between the first input and the first output, and whereby at least one second circuit breaker that is configured as a relay is arranged between the second input and the second output. This makes it possible to utilize the advantages of both types of circuit breaker. Thanks to the relay, to start with, a galvanic disconnection can be achieved. The transistor, in contrast, can quickly switch the current. Preferably, precisely one relay is arranged between the second input and the second output. Here, the insufficient blocking ability of the transistor in the reverse direction is compensated for by the relay that is present. In the simplest case involving just one transistor, the heat loss that occurs is very small and can be managed without any complex cooling equipment.

Preferably, the transistor for a discharge path from the battery to the component is arranged in the forward direction. If the transistor is, for instance, an IGBT, then the collector is connected to the input and the emitter is connected to the output of the battery disconnecting device. Accordingly, in the case of a MOSFET, the drain terminal is connected to the input while the source terminal is connected to the output. The advantage of this circuitry is that, in the discharge direction, the high blocking ability and the fast blocking ability of the transistor in the forward direction are available and consequently, short-circuit currents that could exceed the current carrying capacity of the relay are switched off at an early point in time due to the blocking of the transistor. In the charging path, such fast current changes do not occur in the critical area so that the switch-off by opening the relay is sufficient here.

Aside from the above-mentioned IGBTs and MOSFETs, it is also possible to use GaN or SiC transistors. The GaN transistor is preferably configured as a self-blocking transistor. These transistors particularly have an improved switching behavior.

In another embodiment, at least one diode is arranged parallel to the transistor. This diode is arranged in such a way that, in the charging direction, it is polarized in the direction of flow. Thus, the transistor does not have to be rendered conductive in the reverse direction (inverse operation), which is advantageous in terms of the losses. In configurations where the transistor is configured as a MOSFET, an intrinsic diode (body diode) can be used which is present within the scope of the manufacturing process anyway. In configurations where the transistor is configured as an IGBT, in contrast, the diode is necessarily a separate component. However, even when a MOSFET is used, it is possible to additionally employ a separate diode along with the intrinsic diode since the current carrying capacity of these parasitic diodes is limited.

In another embodiment, several transistors, in other words, at least two transistors, are connected in parallel. Thus, the current can be distributed over the transistors, whereby, however, the heat losses do not increase substantially. Moreover this alleviates, for example, the problem of the current carrying capacity of the intrinsic diodes in the case of MOSFETs since the current is then distributed over several diodes. In this context, it should be mentioned that the number of transistors and diodes is preferably the same, although this is not obligatory.

In one embodiment, all of the transistors connected in parallel have the same design, for example, all of the transistors are MOSFETs, IGBTs, GaN transistors or SiC transistors.

In an alternative embodiment, however, the transistors are intentionally mixed in order to utilize their specific advantages. Here, the types or circuit families can be mixed (e.g. IGBT and MOSFET or GaN and IGBT), and so can the basic materials, that is to say, silicon transistors such as IGBT, MOSFET, GaN and silicon carbide transistors.

In this context, all of the transistors can be operated at the same time. However, it is also conceivable to systematically actuate the most suitable transistors for a given situation, while the other transistors remain blocked. As an alternative, they can be systematically actuated one after the other. For example, first the transistors of a given type are rendered conductive before the other transistors are subsequently rendered conductive.

In a preferred embodiment, IGBTs and MOSFETs are used, whereby their number can be the same, although this is not obligatory. For instance, the number of MOSFETs can be greater or smaller than that of IGBTs.

In another embodiment, the battery disconnecting device has a control unit which is configured to generate control signals for the transistor or transistors and for the relay, whereby the transistor or transistors and the relay are actuated simultaneously. This makes use of the fact that the switching times of the transistors are in the µs range while those of the relay are in the ms range. The reason for this is that, in the case of the relay, the mechanical contact pretension first has to be eliminated before the contact can open. This time delay can now be utilized since the transistors have switched off the battery current before the relay opens, thereby reducing the risk of arcs, especially since the short-circuit currents are normally greater than the current disconnecting capacity of the relay.

Here, the battery disconnecting device can be arranged, for example, in a compact module.

BRIEF DESCRIPTION OF THE DRAWINGS

The invention will be explained in greater detail below with reference to a preferred embodiment. The individual figures show the following.

DETAILED DESCRIPTION OF THE INVENTION

Figure 1:
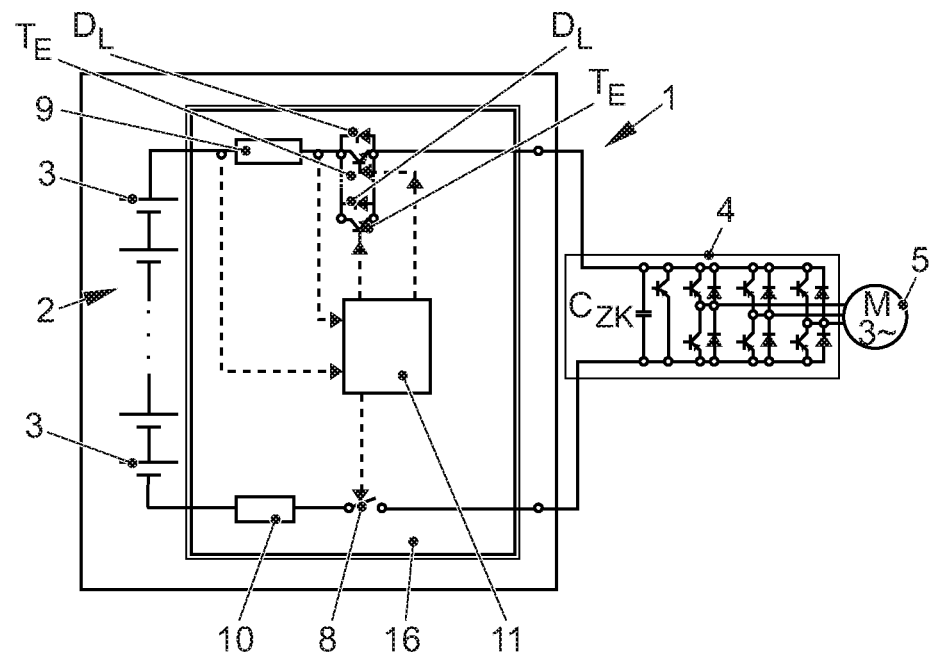
FIG. 1 is a block diagram of a traction system having a battery disconnecting device.

Before the invention is elaborated upon, the state of the art will first be explained making reference to FIGS. 4 and 5. The traction system 1 comprises a battery 2 having a plurality of series-connected battery cells 3, power electronics 4 with DC link capacitor $C_{ZK}$, an electric machine 5 as well as a battery disconnecting device 6. The battery disconnecting device 6 has a first relay 7 and a second relay 8 by means of which the plus line and the minus line can be switched on or off.

Moreover, the battery disconnecting device 6 has a current sensor 9, a fuse 10, a control unit 11, a precharging relay $S_{VL}$ and a precharging resistor $R_{VL}$. The DC link capacitor $C_{ZK}$ is charged with a moderate current via the precharging relay $S_{VL}$ and the precharging resistor $R_{VL}$. For this purpose, first of all, the relay 7 is left open and the relay 8 as well as the precharging relay $S_{VL}$ are closed. Once the DC link capacitor $C_{ZK}$ is charged, the relay 7 is closed and the precharging relay $S_{VL}$ is opened. During operation, the current then flows via the low-resistance path via the two relays 7, 8 so that the heat losses are kept within limits. During battery operation (e.g. driving or charging), overloading of the battery cells 3 and of the relays 7, 8 is prevented in that, for instance, the maximum possible current that the battery 2 can deliver under the momentary boundary conditions (e.g. as a function of the temperature of the battery cell 3) is communicated to a high-voltage control unit of the vehicle via a CAN bus. If the high-voltage voltage components exceed this current, the relays 7, 8 are opened by the control unit 11 on the basis of a predefined plausibilization.

Figure 2A:
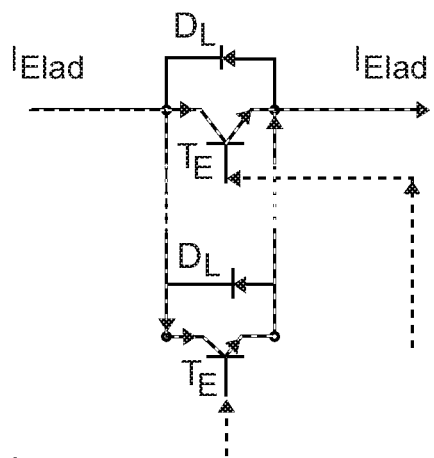
FIG. 2a is a partial view of the battery disconnecting device with a depicted discharging current.
Figure 2B:
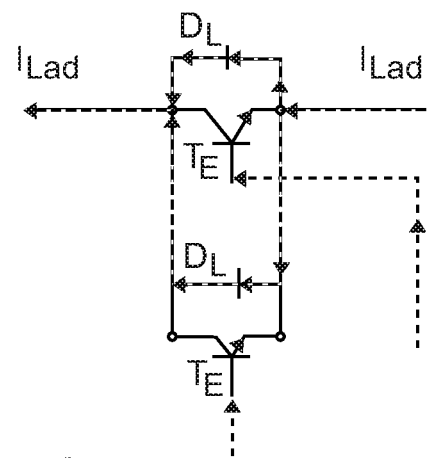
FIG. 2b is a partial view of the battery disconnecting device with a depicted charging current.

FIG. 2 shows a number of characteristic curves, whereby the characteristic curve a represents the current carrying capacity of the fuse 10 while the characteristic curve b represents the current carrying capacity of the relays 7, 8. The figure also shows a characteristic curve c that represents the current disconnecting capacity of the relays 7, 8, in other words, the current that the relays 7, 8 can switch without arc formation. A characteristic curve d is also depicted, which shows the curve of a short-circuit current by way of an example. The characteristic curve e describes a peak current while the characteristic curve f describes a continuous current of the battery 2, whereby the characteristic curves g and h depict the appertaining switching thresholds for the peak current or the continuous current. A peak current arises, for example, when the motor vehicle accelerates. If the peak current stays above the peak current threshold of the characteristic curve g for a period of time $t_1$, then the relays 7, 8 are opened in order to protect the battery cells. This switch-off procedure does not pose a problem since the current lies below the current disconnecting capacity and the current carrying capacity of the relays 7, 8. The continuous current, in contrast, has to be switched off in a timely manner at point in time t2 since otherwise, there is a risk that the relays 7, 8 will fuse together. A short-circuit current in accordance with the characteristic curve d constitutes a problem because, after a short period of time, the peak of the short-circuit current exceeds the current carrying capacity of the relays 7, 8 so that, for safety reasons, the relays 7, 8 have to be replaced each time a short circuit has occurred. In this context, the fuse 10 does not have to be tripped since the peak current is only present for a few ms and consequently the characteristic curve a is not intersected.

Figure 3:
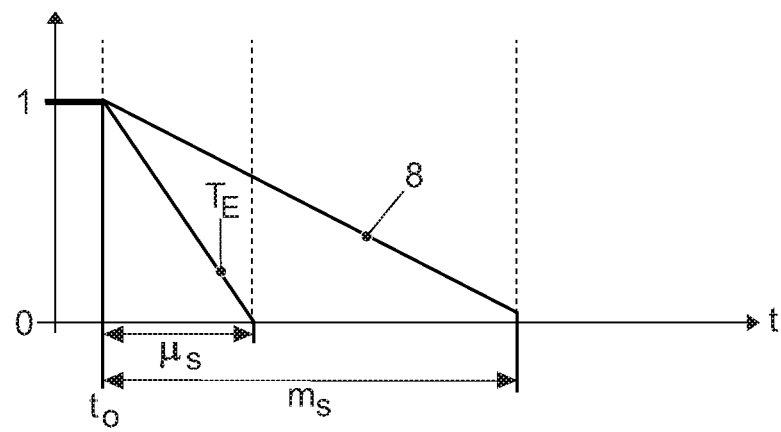
FIG. 3 is a view of the course-over-time of the blocking of the transistor and the opening of the relay.
Figure 4:
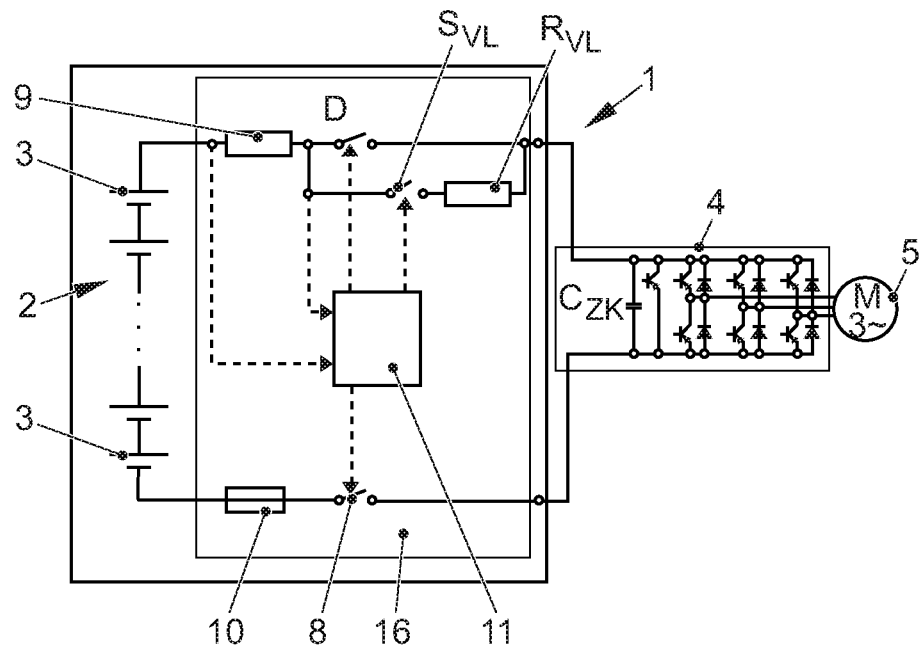
FIG. 4 is a block diagram of a traction system having a battery disconnecting device with two relays (state of the art)
Figure 5:
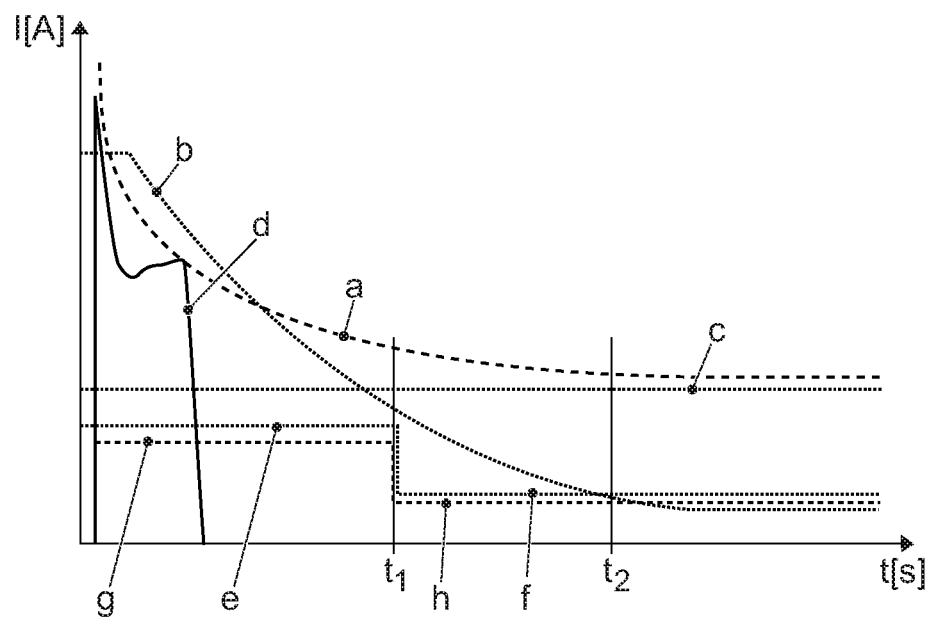
FIG. 5 shows various characteristic curves for a circuit according to FIG. 4.

FIG. 1 shows a traction system 1 having a battery disconnecting device 16 according to the invention, whereby identical elements such as those in the embodiment of FIG. 4 are provided with the same reference numerals. The essential difference from the embodiment of FIG. 4 is that the relay 8 was replaced by a parallel connection of several transistors $T_E$, whereby, thanks to the transistors $T_E$, the precharging relay $S_{VL}$ and the precharging resistor $R_{VL}$ can be dispensed with. In this context, the transistors $T_E$ are connected in such a way that, in the discharging direction, they are connected in the forward direction (also see FIG. 3a). The diodes $D_L$ that, in the charging direction, are connected in the conducting direction, are connected in parallel to the transistors 17. The transistors $T_E$ and the relay 8 are actuated by the control unit 11. The functionality of the precharging relay $S_{VL}$ and the precharging resistor $R_{VL}$ can then be implemented by means of a suitable PWM (pulse-width modulation) actuation of the transistors $T_E$.

In this context, when the transistors $T_E$ are in the discharging direction, that is to say, when current $I_{ELAD}$ is flowing out of the battery 2, they are actuated so as to be in the conductive state. Since the diodes $D_L$ are polarized in the blocking direction, the current $I_{ELAD}$ flows exclusively via the transistors $T_E$. Since the transistors in the conductive state are very low-resistance in the forward direction, the heat losses are low. In the charging direction, the current $I_{LAD}$ flows into the battery 2. For this purpose, the transistors $T_E$ are blocked since, in the inverse operation, they have a higher resistance than the diodes $D_L$. As a result, the heat losses only occur at the diodes $D_L$. As a rule, these heat losses can be managed well so that there is no need for complicated active cooling measures. Moreover, the battery 2 can be galvanically disconnected at a single pole via the relay 8, whereby the relay 8 alone is responsible for the switch-off in the charging direction since the diodes $D_L$ are polarized in the flow direction. In this context, the diodes $D_L$ can be separate diodes $D_L$, or else, if the transistors are configured as MOSFETs, intrinsic diodes (also known as body diodes) of the transistors $T_E$ can be used. As already elaborated upon, the current flow can only be actively switched by the transistors $T_E$ in the discharging direction. However, this is precisely also the critical current direction in case of a short circuit (see FIG. 5, characteristic curve d, where the current carrying capacity of the relay is exceeded). This problem can now be solved by the transistors $T_E$ since they can switch within the µs range. Therefore, in the case of a short circuit, the current can be switched off via the transistors $T_E$ before the current carrying capacity limit of the relay 8 is reached. This also makes it possible to switch transistors $T_E$ and relays simultaneously, even if the current is greater than the current disconnecting capacity (see characteristic curve c, FIG. 5) of the relay, since the current has already been switched off by the transistors $T_E$. This is shown schematically in FIG. 3. Here, the switching state of the transistors $T_E$ and of the relay 8 is shown on the Y axis, whereby the number 1 designates a closed relay 8 or a conductive transistor $T_E$. If the control unit 11 then synchronously actuates the transistors $T_E$ and relays 8 at point in time to, then the transistors $T_E$ are switched off (blocked) after a few µs, whereas the relay 8 only opens after a few ms since the mechanical holding force first has to be eliminated.

Figure 6:
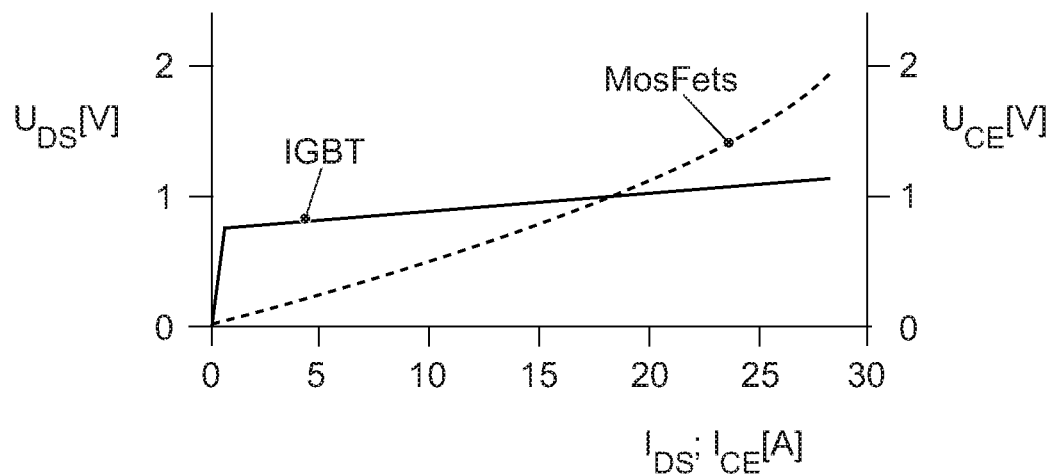
FIG. 6 is a current-voltage characteristic curve for a MOSFET as well as for an IGBT.
Figure 7:
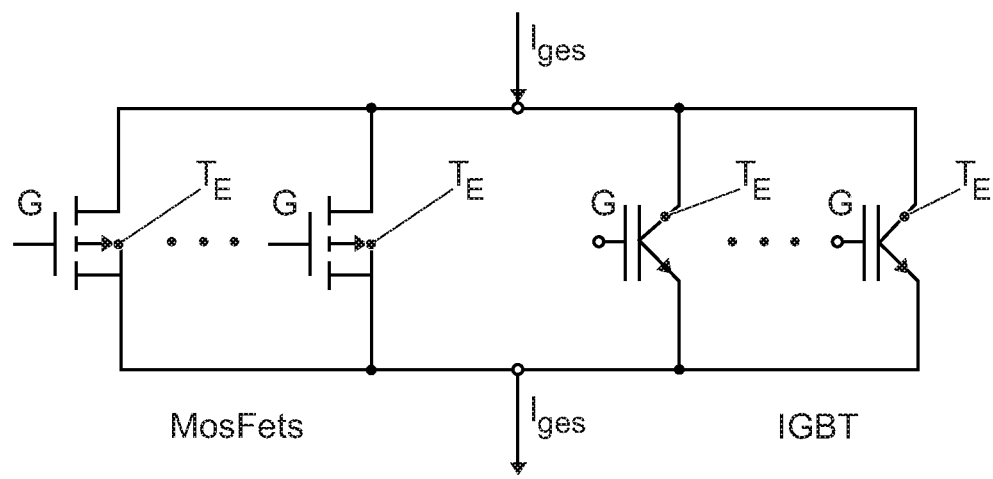
FIG. 7 is a parallel circuit of MOSFETs and IGBTs.

FIG. 6 shows the voltage plotted over the current in the conductive state for a MOSFET and for an IGBT. Here, the resistance of the MOSFET at low currents of up to about 15 A is less than that of the IGBTs, whereby, at higher currents of approximately 25 A, the resistance of the IGBTs is less. For this reason, preference should be given to MOSFETs in the case of low load currents and to IGBTs in the case of higher load currents. These different behaviors can now be systematically utilized, which is shown in FIG. 7, whereby, for the sake of clarity, the diodes $D_L$ are not depicted. In this context, the transistors shown on the left-hand side are configured as MOSFETs while the ones on the right-hand side are configured as IGBTs, whereby the load current $I_{ges}$ is distributed differently, depending on the magnitude. In the lower load range, most of the current flows over the MOSFETs while, in the upper load range, it flows mostly via the IGBTs, which automatically translates into minimum power loss.

As an alternative, only the MOSFETs are rendered connective in the case of low loads, while only the IGBTs are rendered connective in the case of higher loads. It is likewise possible to systematically switch off individual transistors if these have reached a critical temperature range.

The invention claimed is:

1. A battery disconnecting device, comprising:
   a first input and a second input to which a battery can be connected,
   a first output and a second output to which an electric component can be connected,
   at least one first circuit breaker arranged between the first input and the first output, and
   at least one second circuit breaker arranged between the second input and the second output,
   wherein the first circuit breaker includes a plurality of transistors connected in parallel, at least a first transistor of the plurality of transistors and a second transistor of the plurality of transistors consist of different circuit families and/or of different basic materials, and the second circuit breaker is a relay,
   wherein the battery disconnecting device has a control unit that is configured so as to generate control signals for the transistor or transistors and for the relay, whereby the transistor or transistors and the relay are actuated simultaneously,
   wherein the first transistor is a MOSFET and the second transistor is an IGBT; and
   wherein the control unit is configured to change the first circuit breaker's distribution of load current between the first transistor and the second transistor based on a magnitude of the load current.

2. The battery disconnecting device according to claim 1, wherein the transistor for a discharge path from the battery to the component is arranged in the forward direction.

3. The battery disconnecting device according to claim 1, wherein at least one diode is arranged in parallel to the transistor.

4. The battery disconnecting device according to claim 1, wherein the first transistor is a MOSFET and the second transistor is an IGBT.

5. The battery disconnecting device according to claim 1, wherein the control unit is configured to operate the first circuit breaker to distribute more current to the first transistor than the second transistor if the magnitude of the load current is lower a predetermined magnitude, and distribute more current to the second transistor than the first transistor if the magnitude of the load current is above than the predetermined magnitude.

\* \* \* \* \*